(12) United States Patent
Lee

(10) Patent No.: US 10,651,419 B2
(45) Date of Patent: May 12, 2020

(54) DISPLAY DEVICE

(71) Applicant: Samsung Display Co., Ltd., Yongin-si, Gyeonggi-do (KR)

(72) Inventor: Sangwol Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/943,090

(22) Filed: Apr. 2, 2018

(65) Prior Publication Data

US 2018/0294427 A1 Oct. 11, 2018

(30) Foreign Application Priority Data

Apr. 10, 2017 (KR) .................. 10-2017-0046251

(51) Int. Cl.
| | |
|---|---|
| *G06F 1/16* | (2006.01) |
| *H01L 51/52* | (2006.01) |
| *H01L 27/32* | (2006.01) |
| *H05K 1/14* | (2006.01) |
| *H05K 5/00* | (2006.01) |

(Continued)

(52) U.S. Cl.
CPC .......... *H01L 51/524* (2013.01); *G06F 1/1652* (2013.01); *G06F 3/041* (2013.01); *H01L 27/323* (2013.01); *H01L 27/3276* (2013.01); *H01L 27/3288* (2013.01); *H01L 51/0097* (2013.01); *H01L 51/5237* (2013.01); *H01L 51/5243* (2013.01); *H01L 51/5281* (2013.01); *H05K 1/147* (2013.01); *H05K 5/0017* (2013.01); *H05K 5/03* (2013.01); *G06F 2203/04102* (2013.01); *H01L 51/5259* (2013.01); *H01L 51/5284* (2013.01); *H01L 2251/5338* (2013.01);

(Continued)

(58) Field of Classification Search
None
See application file for complete search history.

(56) References Cited

U.S. PATENT DOCUMENTS

| | | |
|---|---|---|
| 7,817,220 B2 | 10/2010 | Suh et al. |
| 8,730,427 B2 | 5/2014 | Lee |

(Continued)

FOREIGN PATENT DOCUMENTS

| | | |
|---|---|---|
| KR | 10-2012-0133141 A | 12/2012 |
| KR | 10-2013-0035092 A | 4/2013 |

(Continued)

*Primary Examiner* — Christopher J Kohlman
(74) *Attorney, Agent, or Firm* — Lewis Roca Rothgerber Christie LLP

(57) ABSTRACT

According to some example embodiments of the present invention, a display device includes: a display panel, the display panel being flexible and including an active region for displaying an image, and a peripheral region outside the active region when viewed in a plan view; a window structure on the display panel; a printed circuit board electrically connected to the display panel; a flexible circuit board connecting the display panel to the printed circuit board; and a cover structure adjacent to the window structure, when viewed in the plan view, wherein the cover structure includes: a cover portion overlapped with the flexible circuit board, when viewed in the plan view; and a sidewall portion extending downwardly from the cover portion, and the cover portion has a bottom surface that is coplanar with a bottom surface of the window structure.

20 Claims, 9 Drawing Sheets

(51) Int. Cl.
*H05K 5/03* (2006.01)
*G06F 3/041* (2006.01)
*H01L 51/00* (2006.01)

(52) U.S. Cl.
CPC . *H05K 2201/042* (2013.01); *H05K 2201/056* (2013.01); *H05K 2201/10128* (2013.01)

(56) References Cited

U.S. PATENT DOCUMENTS

| | | | |
|---|---|---|---|
| 9,048,444 B2 | 6/2015 | Kim et al. | |
| 2013/0082988 A1 | 4/2013 | Lee et al. | |
| 2014/0085932 A1* | 3/2014 | Jeong | G02B 6/0093 362/613 |
| 2015/0035001 A1* | 2/2015 | Yamazaki | H01L 51/5253 257/100 |
| 2015/0043174 A1* | 2/2015 | Han | G02F 1/13452 361/749 |
| 2015/0220117 A1* | 8/2015 | Lee | G06F 1/1641 361/749 |
| 2015/0241925 A1* | 8/2015 | Seo | G06F 1/1652 361/679.27 |
| 2016/0041679 A1 | 2/2016 | Ahn et al. | |
| 2016/0072094 A1* | 3/2016 | Kim | H01L 51/529 315/112 |
| 2016/0275830 A1 | 9/2016 | You et al. | |
| 2016/0291642 A1* | 10/2016 | Kwak | G06F 1/1652 |
| 2017/0208157 A1* | 7/2017 | Kim | G06F 1/1652 |
| 2017/0374749 A1* | 12/2017 | Lee | E05D 11/0054 |

FOREIGN PATENT DOCUMENTS

| | | |
|---|---|---|
| KR | 10-2013-0065075 A | 6/2013 |
| KR | 10-2013-0106503 A | 9/2013 |
| KR | 10-1340517 B1 | 12/2013 |
| KR | 10-2014-0080272 A | 6/2014 |
| KR | 10-2014-0108826 A | 9/2014 |
| KR | 10-2015-0010411 A | 1/2015 |
| KR | 10-1534428 B1 | 7/2015 |
| KR | 10-2016-0019597 A | 2/2016 |
| KR | 10-2016-0082082 A | 7/2016 |
| KR | 10-2016-0111839 A | 9/2016 |
| WO | WO 2012/129247 A2 | 9/2012 |

* cited by examiner

DISPLAY DEVICE

CROSS-REFERENCE TO RELATED APPLICATION

This application claims priority to and the benefit of Korean Patent Application No. 10-2017-0046251, filed on Apr. 10, 2017, in the Korean Intellectual Property Office, the entire content of which is hereby incorporated by reference.

BACKGROUND

Some example embodiments of the present disclosure relate to a display device.

A display device is configured to display various images on its display screen and is used to provide information to a user. Recently, a foldable or rollable display device with a bendable or flexible display structure is being developed. A flexible display device, unlike the flat panel display device, may be folded or rolled, like a piece of paper. Because the shape of the flexible display device can be changed into various shapes or positions, the flexible display device is used to improve portability and user convenience.

The above information disclosed in this Background section is only for enhancement of understanding of the background and therefore it may contain information that does not constitute prior art.

SUMMARY

Some example embodiments of the present disclosure relate to a display device. For example, some example embodiments include a display device with improved durability and reduced thickness.

According to some example embodiments of the present invention, a display device includes: a display panel, the display panel being flexible and including an active region for displaying an image, and a peripheral region outside the active region when viewed in a plan view; a window structure on the display panel; a printed circuit board electrically connected to the display panel; a flexible circuit board connecting the display panel to the printed circuit board; and a cover structure adjacent to the window structure, when viewed in the plan view, wherein the cover structure includes: a cover portion overlapped with the flexible circuit board, when viewed in the plan view; and a sidewall portion extending downwardly from the cover portion, and the cover portion has a bottom surface that is coplanar with a bottom surface of the window structure.

According to some embodiments, a side surface of the cover portion adjacent to the window structure is in contact with a side surface of the window structure.

According to some embodiments, the display device further includes a folding region configured to be folded along a folding axis extending in a first direction, when viewed in the plan view, and the cover structure is adjacent to the window structure in a second direction crossing the first direction.

According to some embodiments, the display device further includes a supporting structure below the display panel, wherein the supporting structure comprises a first supporting portion overlapped with the folding region and configured to be folded along the folding axis.

According to some embodiments, the first supporting portion comprises a plurality of joint portion, each of which has a rod shape extending in the second direction, the plurality of joint portions being arranged in the first direction and connected to each other.

According to some embodiments, the supporting structure further comprises at least one second supporting portion connected to the first supporting portion in the first direction and having a plate shape.

According to some embodiments, the display device further includes a supporting structure below the display panel, wherein the supporting structure comprises a second supporting portion having a plate shape and overlapping a portion the display device excepting the folding region.

According to some embodiments, the cover structure comprises a metallic material.

According to some embodiments, the display panel further comprises an optical structure between the window structure and the display panel and including a polarization layer.

According to some embodiments, the display device further includes an input-sensing unit between the window structure and the display panel and including a plurality of sensing electrodes.

According to some embodiments, the printed circuit board is below display panel.

According to some embodiments, the display device further includes a reinforcing member between the printed circuit board and the display panel.

According to some embodiments, the reinforcing member comprises a silicon-based material.

According to some embodiments, the display device further includes a filler provided in an empty space that is defined by the cover portion, the sidewall portion, and the flexible circuit board.

According to some embodiments, the window structure includes: a light-transmitting portion overlapped with the active region; and a light-blocking portion overlapped with at least a portion of the peripheral region.

According to some example embodiments of the present invention, a display device includes: a display panel, the display panel being flexible and including an active region for displaying an image, and a peripheral region outside the active region when viewed in a plan view; a window structure on the display panel; a printed circuit board below the display panel; a cover structure adjacent to at least a side of the window structure, when viewed in the plan view, wherein a portion of a side of the peripheral region of the display panel is bent downwardly and is connected to the printed circuit board, the cover structure comprises a cover portion overlapped with the bent portion of the display panel and a sidewall portion extending downwardly from the cover portion, and the cover portion has a bottom surface that is coplanar with a bottom surface of the window structure.

According to some embodiments, the display device further includes a folding region configured to be folded along a folding axis extending in a first direction, when viewed in the plan view, and the cover structure is adjacent to at least one side of the window structure in a second direction crossing the first direction.

According to some embodiments, the display device further includes a reinforcing member between the printed circuit board and the display panel.

According to some embodiments, the display device further includes a filler in an empty space defined by the cover portion, the sidewall portion, and the bent portion of the display panel.

According to some example embodiments of the present invention, a display device includes: a display panel, the display panel being flexible and including an active region for displaying an image, and a peripheral region outside the active region, when viewed in a plan view; a window structure on the display panel; a printed circuit board electrically connected to the display panel; a flexible circuit board connecting the display panel to the printed circuit board; and a cover structure adjacent the window structure, when viewed in the plan view, wherein the cover structure includes: a cover portion overlapped with the flexible circuit board, when viewed in the plan view; and a sidewall portion extending downwardly from the cover portion, wherein a side surface of the cover portion adjacent to the window structure is in contact with a side surface of the window structure.

BRIEF DESCRIPTION OF THE DRAWINGS

Aspects of one or more example embodiments will be more clearly understood from the following brief description taken in conjunction with the accompanying drawings. The accompanying drawings represent non-limiting, example embodiments as described herein.

Figure 1A:
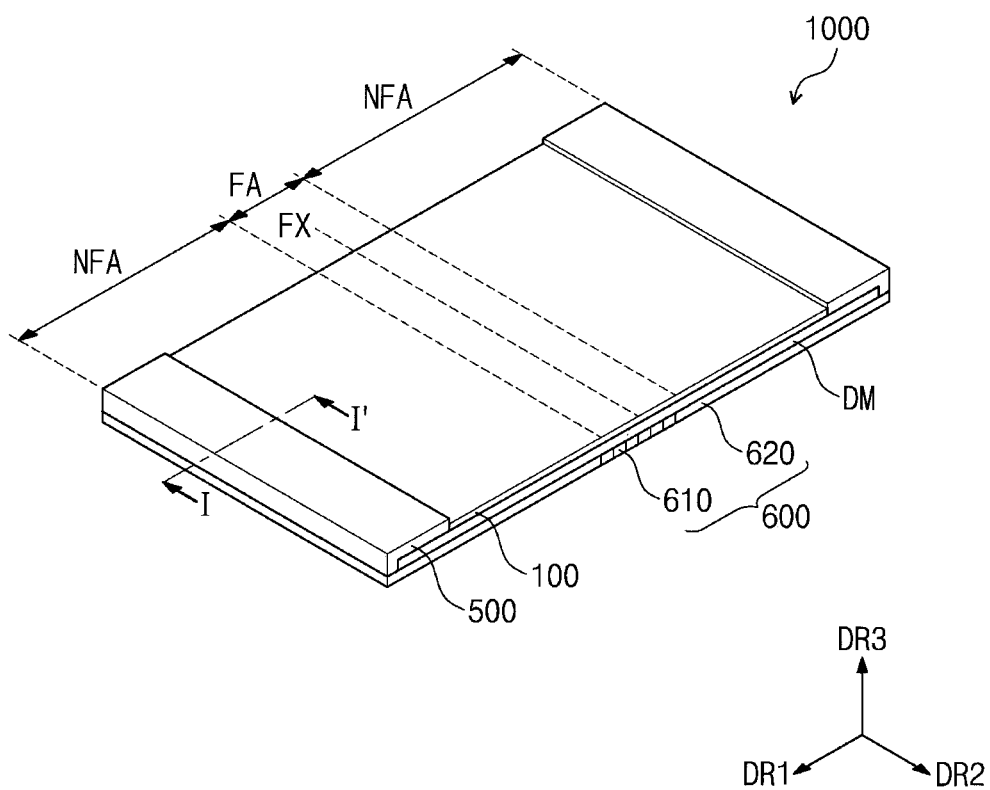
FIG. 1A is a perspective view illustrating a display device according to some example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Aspects of some example embodiments of the present invention will now be described more fully with reference to the accompanying drawings, in which example embodiments are shown. Example embodiments of the present invention may, however, be embodied in many different forms and should not be construed as being limited to the embodiments set forth herein; rather, these embodiments are provided so that this disclosure will be more thorough and more complete, and will more fully convey aspects of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directed connected or coupled the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing aspects of some example embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the present invention belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
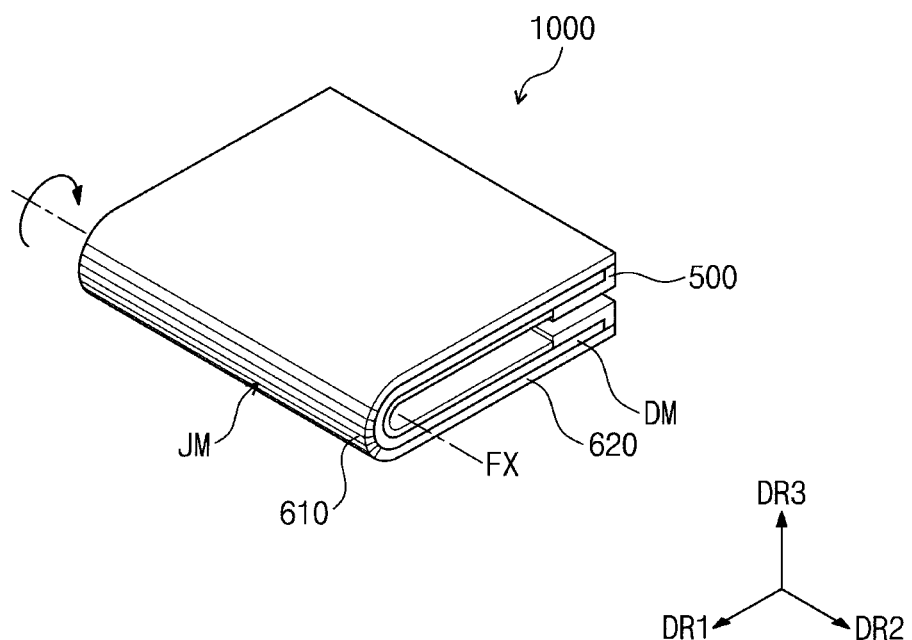
FIG. 1B is a diagram illustrating the display device of FIG. 1A in an in-folding state.

FIG. 1A is a perspective view illustrating a display device according to some example embodiments of the present invention. FIG. 1B is a diagram illustrating the display device of FIG. 1A in an in-folding state, and FIG. 1C is a diagram illustrating the display device of FIG. 1A in an out-folding state.

Figure 1C:
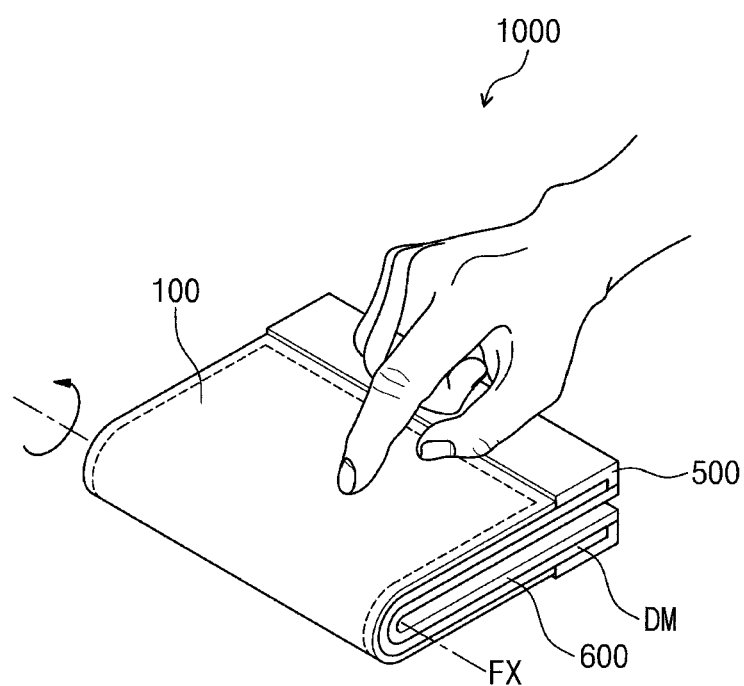
FIG. 1C is a diagram illustrating the display device of FIG. 1A in an out-folding state.
Figure 1C:
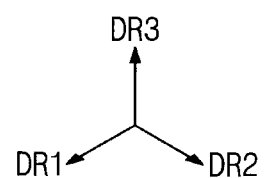

Referring to FIGS. 1A to 1C, a display device 1000 according to some example embodiments of the present invention may have a rectangular shape whose long sides are parallel to a first direction DR1 and whose short sides are parallel to a second direction DR2, where the first and second directions DR1 and DR2 are not parallel to each other. However, the example embodiments are not limited thereto, and in some embodiments, the shape of the display device 1000 may be variously changed.

According to some example embodiments, the display device 1000 may be a flexible display device. For example, the display device 1000 may be folded or unfolded along a folding axis FX extending in a specific direction. In other words, the display device 1000 may be a foldable display device. In some embodiments, the folding axis FX may be parallel to the second direction DR2. The display device 1000 may be divided into a plurality of regions, according to its folding state. For example, the display device 1000 may be divided into a folding region FA and at least one non-folding region NFA, when viewed in a plan view. The folding region FA may be a region, on which folding stress is exerted, when the display device 1000 is folded. The folding region FA may be overlapped with the folding axis FX.

The display device 1000 according to some example embodiments may also be a rollable display device that is configured to be rolled around a rotating axis. In certain embodiments, the display device may be provided in various forms, if it has a flexible property.

Figure 2A:
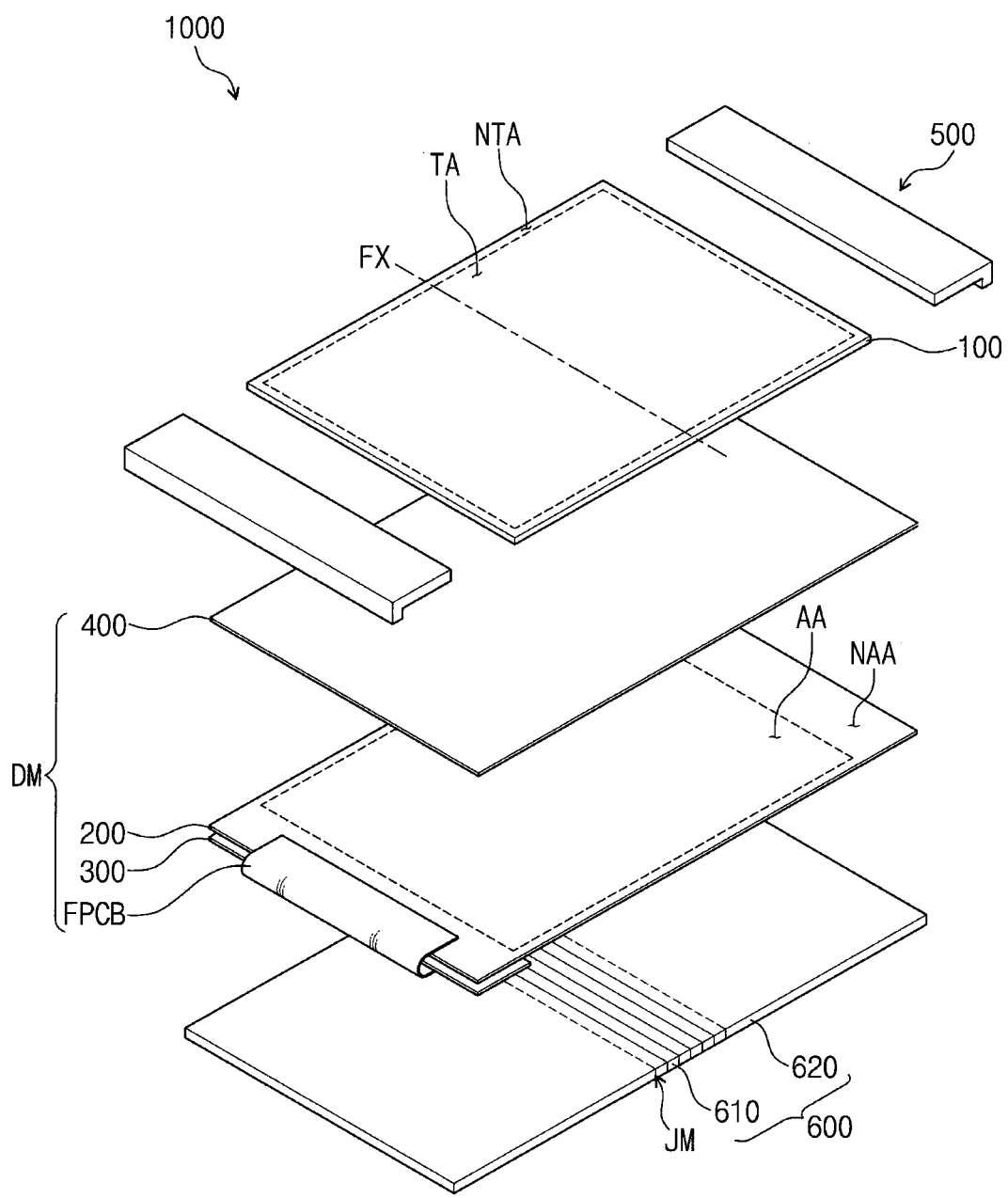
FIG. 2A is an exploded perspective view illustrating the display device of FIG. 1A.
Figure 2B:
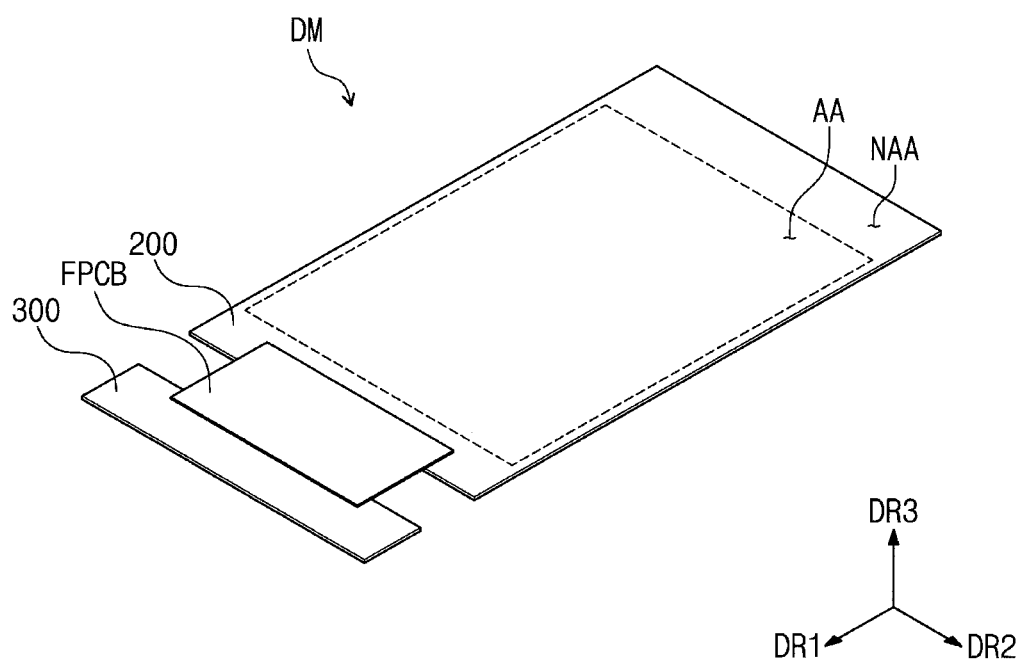
FIG. 2B is a perspective view illustrating the display module of FIG. 2A.
Figure 3:
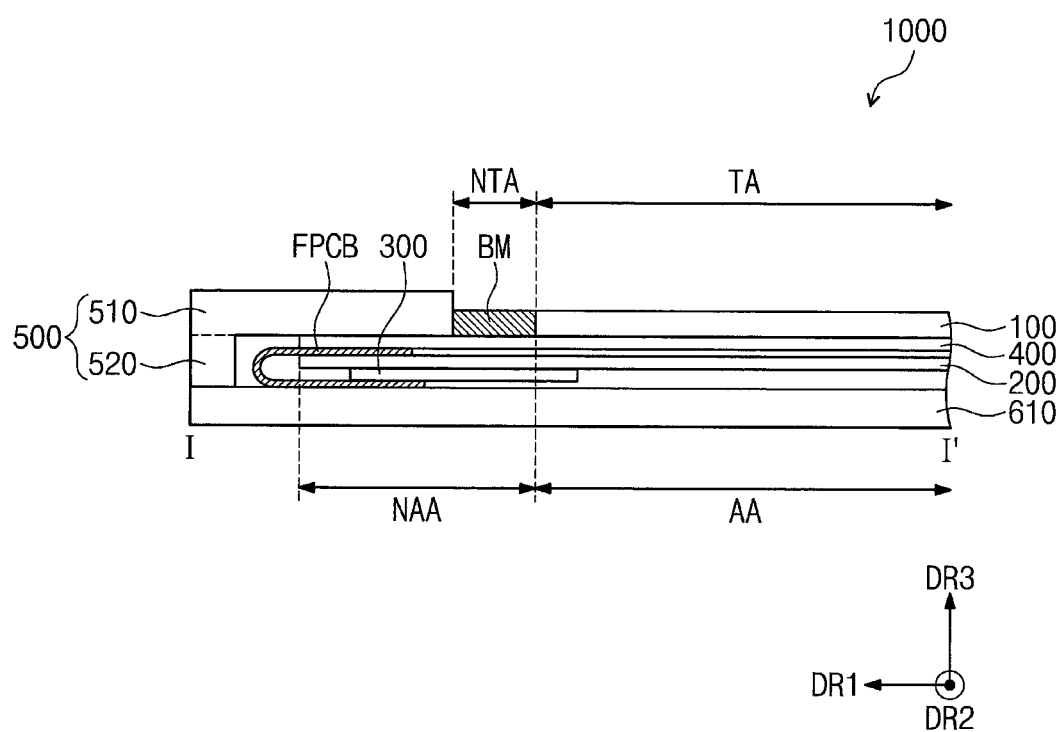
FIG. 3 is a sectional view taken along the line I-I' of FIG. 1A.

FIG. 2A is an exploded perspective view illustrating further details of the display device of FIG. 1A, and FIG. 2B is a perspective view illustrating further details of the display module of FIG. 2A. FIG. 3 is a sectional view taken along the line I-I' of FIG. 1A. Referring further to FIGS. 2A, 2B, and 3, the display device 1000 may include a window structure (or window) 100, a display module DM, and a cover structure 500.

The window structure 100 may include a light-transmitting portion TA, which is configured to allow an image light, which is provided from the display module DM, to pass therethrough, and a light-blocking portion NTA, which is adjacent to the light-transmitting portion TA and is configured to prevent (or reduce) the image light from passing therethrough. The light-blocking portion NTA may be provided around the light-transmitting portion TA and may have a frame shape enclosing the light-transmitting portion TA. In some embodiments, the light-blocking portion NTA may be a black matrix BM.

But example embodiments are not limited thereto, and the window structure 100 of the display device 1000 may be configured to have only the light-transmitting portion TA. For example, in certain embodiments, the light-blocking portion NTA may be omitted. Accordingly, the window structure 100 may be configured to allow the image light to pass through the entire top surface thereof. In addition, in certain embodiments, the light-blocking portion NTA may be provided at a portion of a peripheral region of the light-transmitting portion TA (e.g., near only one of sides).

The window structure 100 may be formed of or include at least one of glass, sapphire, or plastic materials.

The display module DM may be provided below the window structure 100. The display module DM may include a display structure (or display panel) 200, a printed circuit board 300, and a flexible circuit board FPCB.

For convenience in illustration, FIG. 2B illustrates an unfolded shape of the display module DM shown in FIGS. 2A and 3.

The display structure 200 may include an active region AA and a peripheral region NAA enclosing the active region AA, when viewed in a plan view. The active region AA may be overlapped with the light-transmitting portion TA of the window structure 100, and the peripheral region NAA may be overlapped with the light-blocking portion NTA of the window structure 100. In some embodiments, when viewed in a plan view, the display structure 200 may have an area larger than that of the window structure 100.

The display structure 200 may have a flexible property. For example, the display structure 200 may be formed of or include polyimide.

The display structure 200 may be configured to display an image through the active region AA. The display structure 200 may include a plurality of pixels. In the case where an electrical signal is applied to each of the pixels, each of the pixels may be configured to emit light corresponding to the electrical signal.

A type of the display structure 200 may be determined, depending on a type of the display structure 200 (e.g., depending on configuration of the pixels of the display structure 200). In some embodiments, the display structure 200 may be an organic light emitting display panel. However, example embodiments are not limited to a specific type of the display structure 200. In certain embodiments, the display structure 200 may be one of a liquid crystal display panel, an electrophoresis display panel, an electrowetting display panel, or various other display panels configured to display an image thereon. In addition, example embodiments are not limited to a specific type of the display structure 200.

In some embodiments, the display structure 200 may be configured to have a touch-sensing function. In other words, the display structure 200 may be a display panel in which a touch-sensing function is embedded. For example, the display structure 200 may be configured to sense an external touch signal provided through the active region AA. Although not shown, the display structure 200 may further include a touch cell, in which sensing electrodes sensing an external touch signal are provided, and driving interconnection lines, which are used to apply an electrical signal to the touch cell or transmit an electrical signal generated in the touch cell to the outside.

The touch signal may be provided in various manners. For example, the touch signal may be input to the display structure 200 through a portion of a user's body (e.g., a finger). However, example embodiments are not limited to a specific way of providing a touch signal. For example, in certain embodiments, the touch signal may be input using one of optical, contact-sensitive, or magnetic manners.

The display structure 200 may be configured to sense the touch signal in various manners. A an example, the display structure 200 may be configured to operate in one of resistive-layer, electrostatic-capacitance, and electromagnetic-induction manners and may be used to obtain information on coordinates of a position at which a touch event occurs.

In the case where the display structure 200 is not a display panel in which a touch-sensing function is embedded, the display module DM may further include a input-sensing unit provided between the display structure 200 and the window structure 100. The input-sensing unit may be configured to sense an external touch signal to be provided from the outside.

The printed circuit board 300 may be provided below the display structure 200. However, example embodiments are not limited to a specific position of the printed circuit board 300. For example, in certain embodiments, the printed circuit board 300 may be provided adjacent to a side or top surface of the display structure 200. Even in this case, the printed circuit board 300 may be such that it does not overlap with the active region AA of the display structure 200.

In addition, example embodiments are not limited to a specific material of the printed circuit board 300. For example, in the present embodiment, the printed circuit board 300 may be configured to have higher rigidity than that of the flexible circuit board FPCB, but in certain embodiments, the printed circuit board 300 may be configured to include the same material as that of the flexible circuit board FPCB. That is, in certain embodiments, the printed circuit board 300 may have a flexible property.

The flexible circuit board FPCB may be provided to electrically connect the display structure 200 and the printed circuit board 300 to each other. For example, a portion of the flexible circuit board FPCB may be bonded to a portion of the peripheral region NAA of the display structure 200, which is defined in the first direction DR1, and an opposite portion of the flexible circuit board FPCB may be bonded to the printed circuit board 300.

The printed circuit board 300 may be used to provide an electrical signal to the display structure 200 and to receive a touch signal from the display structure 200 through the flexible circuit board FPCB. According to some embodiments, a driving chip may be provided on at lease one of the flexible circuit board FPCB and the printed circuit board 300.

The flexible circuit board FPCB may have a flexible property. As shown in FIGS. 2 and 3, in the case where the printed circuit board 300 is placed below the display structure 200, the flexible circuit board FPCB may be bent from a side portion of the display structure 200 toward a side portion of the printed circuit board 300.

According to some example embodiments, the display module DM may further include an optical structure 400 provided between the window structure 100 and the display structure 200.

Example embodiments are not limited to a specific kind of the optical structure 400. For example, the optical structure 400 may include a polarization layer, and in this case, the optical structure 400 may selectively transmit or absorb light, which is provided from the display structure 200, depending on a polarization state of the light. In certain embodiments, the optical structure 400 may include a plurality of prisms, and in this case, the optical structure 400 may be used to condense light provided from the display structure 200. In addition, example embodiments are not limited to a specific structure of the optical structure 400, and various other structures of the optical structure 400 may be used. The cover structure 500 may be provided on the display module DM. The cover structure 500 may extend in the second direction DR2 and may be partially overlapped with the non-folding region NFA of the display device 1000.

In some embodiments, a plurality of the cover structures 500 may be provided. When viewed in a plan view, the cover structures 500 may be provided adjacent to at least opposite sides, respectively, of the window structure 100 in the first direction DR1.

Example embodiments are not limited to the specific number of the cover structure 500. In certain embodiments, the display device 1000 may have only one cover structure 500, which is provided adjacent to a side of the window structure 100 in the first direction DR1. Alternatively, the cover structure 500 may be provided adjacent to the window structure 100 in the non-folding region NFA, but not in the folding region FA without limitation on the number and position of the cover structure 500.

The cover structure 500 may be formed of or include a metallic material. In some embodiments, the cover structure 500 may be formed of or include an aluminum-magnesium alloy. But example embodiments are not limited thereto. In certain embodiments, the cover structure 500 may be formed of or include at least one of several rigid materials.

The cover structure 500 may include a cover portion 510 and a sidewall portion 520. The cover portion 510 may have a rectangular plate shape whose long sides are parallel to the second direction DR2 and whose short sides are parallel to the first direction DR1. The cover portion 510 may be provided on the display module DM to cover at least a portion of the display module DM located in the first direction DR1. In other words, the cover portion 510 may be provided to cover a portion of the display module DM, which is not overlapped with the window structure 100 when viewed in a plan view.

For example, the cover portion 510 may be provided to be overlapped with the flexible circuit board FPCB of the display module DM, when viewed in a plan view.

In embodiments where, the cover structure 500 does not cover the flexible circuit board FPCB, the flexible circuit board FPCB may be damaged by an external impact, or a connection portion between the display structure 200 and the flexible circuit board FPCB or between the printed circuit board 300 and the flexible circuit board FPCB may be broken. By contrast, according to some example embodiments, it may be possible to prevent (or reduce instances of) the flexible circuit board FPCB from being damaged or from being shorted with the display structure 200 or the printed circuit board 300.

In some embodiments, one of side surfaces of the cover portion 510 may be in contact with a side surface of the window structure 100 that is opposite thereto. Furthermore, the cover portion 510 may have a bottom surface that is coplanar with a bottom surface of the window structure 100. Because the window structure 100 and the cover portion 510 are not overlapped with each other in a plan view, it may be possible to reduce a thickness of the display device 1000.

The sidewall portion 520 may extend from the bottom surface of the cover portion 510 in a downward direction, thereby serving as a sidewall of the display device 1000.

The display device 1000 may further include a supporting structure 600. The supporting structure 600 may be provided at the lowermost position of the display device 1000 to support the display module DM.

The supporting structure 600 may include a first supporting portion 610 and a second supporting portion 620. The first supporting portion 610 may be overlapped with the folding region FA. The second supporting portion 620 may be overlapped with the non-folding region NFA. The first supporting portion 610 and the second supporting portion 620 may be connected to each other to form a single body.

The first supporting portion 610 may include a plurality of joint portions JM. Each of the joint portions JM may have a rod shape extending in the second direction DR2. The joint portions JM may be connected to each other and may be arranged in the first direction DR1, within the folding region FA. The joint portions JM may be configured to allow the first supporting portion 610 to be folded along the folding axis FX.

The joint portions JM may be connected to each other by connection members, which are provided between respective pairs of the joint portions JM. When the first supporting portion 610 is folded, distances of the joint portions JM may be changed by the connecting portions.

In some embodiments, the connection members may include an elastic material. However, example embodiments are not limited to a specific material of the connection members.

In certain embodiments, the joint portions JM may include an elastic material. For example, the joint portions JM may be formed of or include a silicone-based material. In this case, a width of each of the joint portions JM may be changed, when the first supporting portion 610 is folded.

According to some example embodiments, the first supporting portion 610 may be provided in the form of a single object that is wholly overlapped with the folding region FA. That is, the first supporting portion 610 may not have the joint portions JM. In this case, the first supporting portion 610 may include an elastic material.

Although some example structures of the first supporting portion 610 have been described in the above embodiments, example embodiments are not limited to a specific structure of the first supporting portion 610.

The second supporting portion 620 may be connected to at least one side of the first supporting portion 610 in the first direction DR1. The second supporting portion 620 may be coupled to the sidewall portion 520 of the cover structure 500 and may be used to protect the display module DM.

Figure 4A:
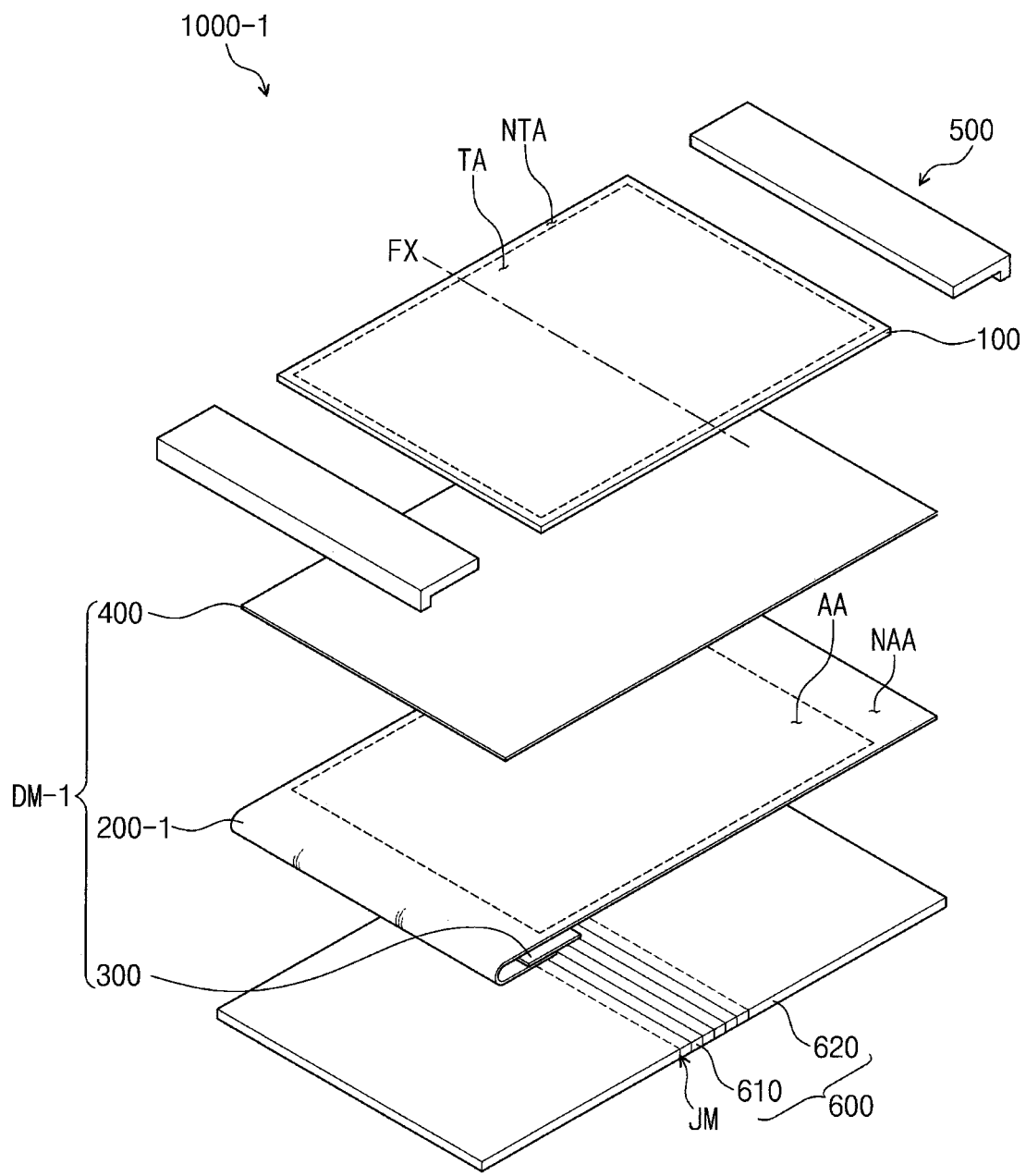
FIG. 4A is an exploded perspective view illustrating a display device according to some example embodiments.
Figure 4B:
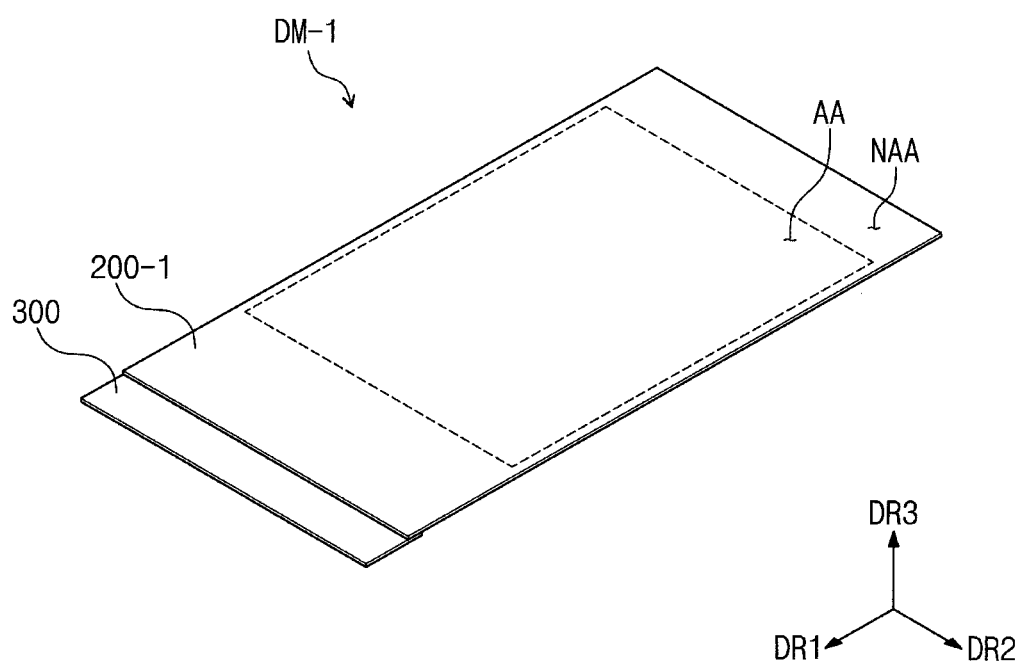
FIG. 4B is a perspective view illustrating the display module of FIG. 4A.
Figure 5:
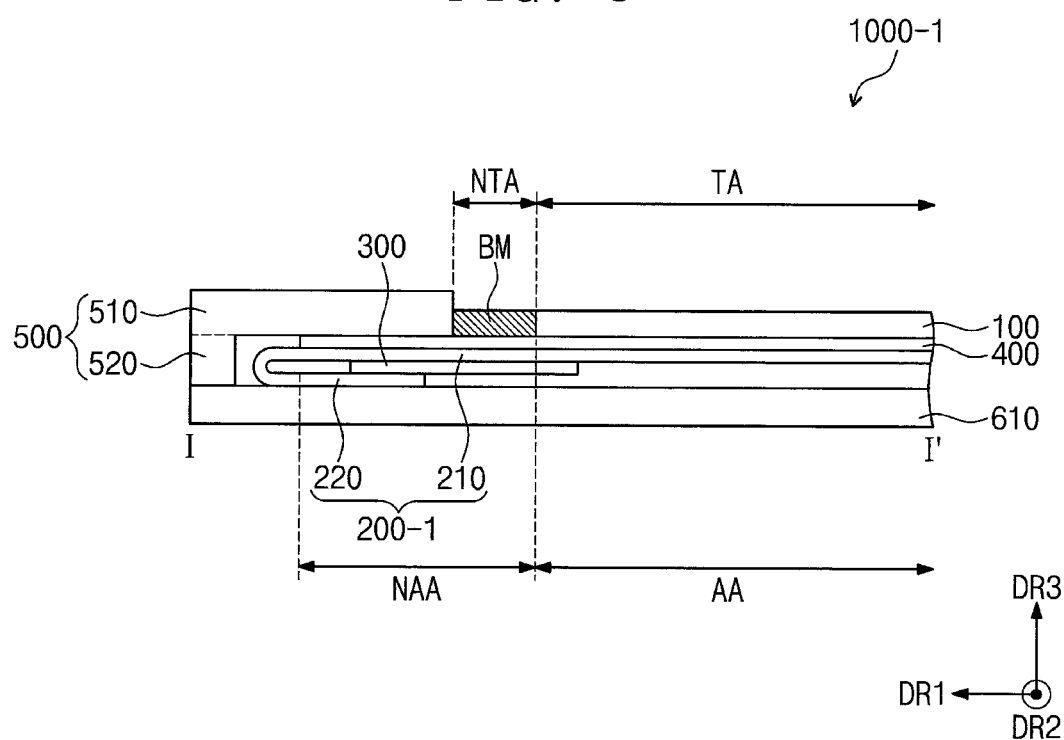
FIG. 5 is a sectional view illustrating a display device according to some example embodiments.

FIG. 4 is an exploded perspective view illustrating a display device according to some example embodiments, and FIG. 4B is a perspective view illustrating the display module of FIG. 4A. FIG. 5 is a sectional view of the display device shown in FIG. 4. In the following description of FIGS. 4A, 4B, and 5, a previously described element may be identified by a similar or identical reference number without repeating an overlapping description thereof, for the sake of brevity.

Referring to FIGS. 4A, 4B, and 5, a display module DM-1, according to some example embodiments, may include a display structure 200-1 and the printed circuit board 300.

The display structure 200-1 may include the active region AA and the peripheral region NAA enclosing the active region AA. The active region AA may be overlapped with the light-transmitting portion TA of the window structure 100.

The printed circuit board 300 may be provided below the display structure 200-1. However, example embodiments are not limited to a specific position of the printed circuit board 300. For example, in certain embodiments, the printed circuit board 300 may be provided adjacent to a side or top surface of the display structure 200-1. Even in this case, the printed circuit board 300 may be provided not to be overlapped with the active region AA of the display structure 200-1.

The printed circuit board 300 may be connected to the display structure 200-1. In detail, the display structure 200-1 may include a side portion, which is downwardly bent in the first direction DR1 and is connected to the printed circuit board 300. That is, the flexible circuit board FPCB (e.g., see FIG. 1) may be omitted.

Figure 6:
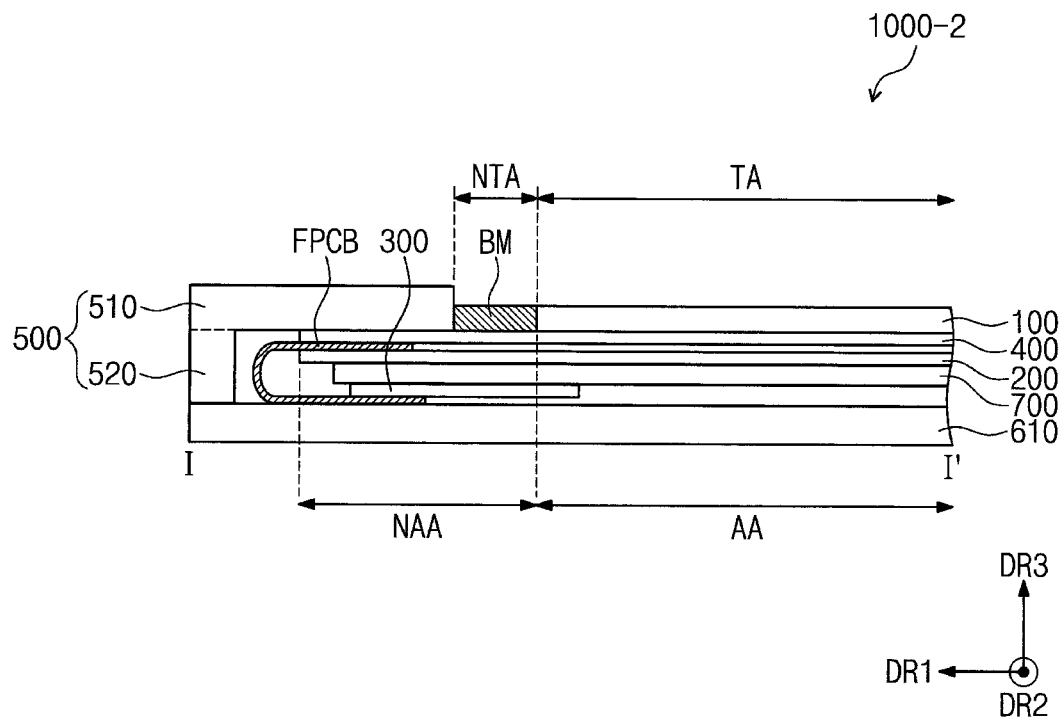
FIG. 6 is a sectional view illustrating a display device according to some example embodiments.

FIG. 6 is a sectional view illustrating a display device according to some example embodiments. In the following description of FIG. 6, a previously described element may be identified by a similar or identical reference number without repeating an overlapping description thereof, for the sake of brevity.

Referring to FIG. 6, a display device 1000-2, according to some example embodiments, may further include a reinforcing member 700.

The reinforcing member 700 may be provided between the display structure 200 and the printed circuit board 300.

The reinforcing member 700 may have a plate shape. In some embodiments, the reinforcing member 700 may include an elastic material. For example, the reinforcing member 700 may be formed of or include silicon. However, example embodiments not limited to material and a shape of the reinforcing member 700, and the material and shape of the reinforcing member 700 may be variously changed.

In the present embodiment, a position of the reinforcing member 700 may be changed, depending on the elasticity of the reinforcing member 700. For example, in the case where the elasticity of the reinforcing member 700 is higher than a reference elasticity, the reinforcing member 700 may be provided on all of the folding region FA and the non-folding region NFA. By contrast, in the case where the elasticity of the reinforcing member 700 is lower than the reference elasticity, the reinforcing member 700 may be locally provided on only the non-folding region NFA. The reference elasticity may be determined in consideration of a folding state or radius of the display device 1000.

According to some example embodiments, because the display device 1000-2 further includes the reinforcing member 700, it may be possible to further improve durability of the display device 1000-2.

Figure 7:
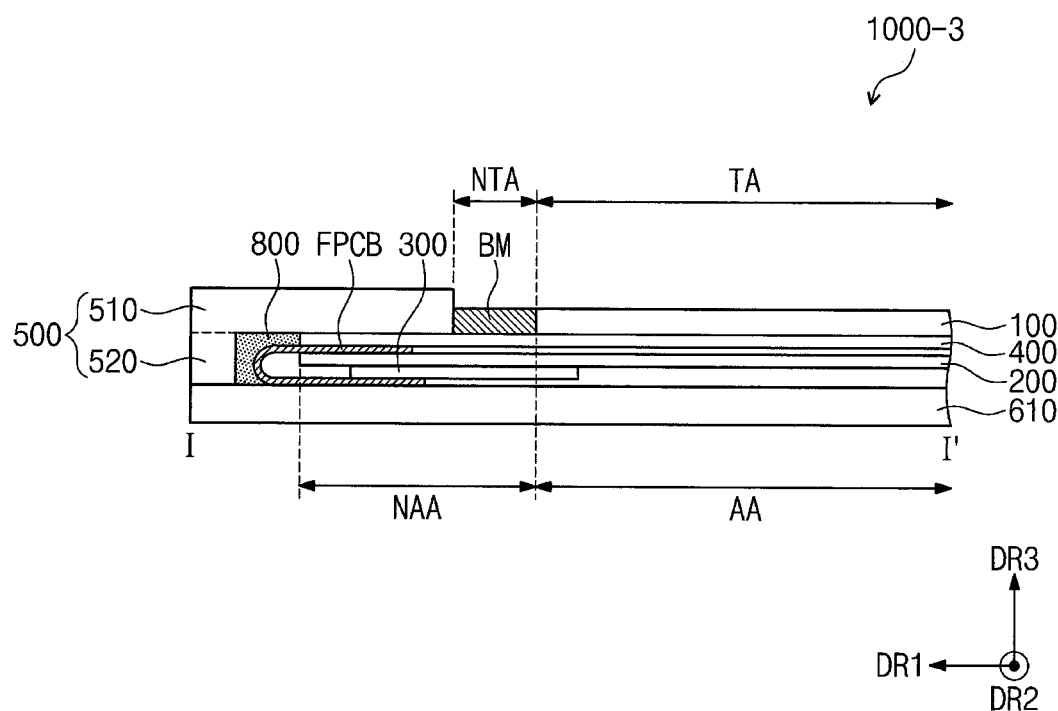
FIG. 7 is a sectional view illustrating a display device according to some example embodiments.

FIG. 7 is a sectional view illustrating a display device according to some example embodiments. In the following description of FIG. 7, a previously described element may be identified by a similar or identical reference number without repeating an overlapping description thereof, for the sake of brevity.

Referring to FIG. 7, a display device 1000-3, according to some example embodiments, may further include a filler 800. The filler 800 may be provided in an empty space that is defined by an inner surface of the cover structure 500 and an outer circumference surface of the flexible circuit board FPCB.

The filler 800 may include a polymer resin. In detail, the filler 800 may be formed of or include at least one of photo-curable resins or thermo-curable resins. For example, the filler 800 may include at least one of polyethylene terephthalate (PET), polymethyl methacrylate (PMMA), poly carbonate (PC), triacetate cellulose (TAC), or cyclo olefin polymer (COP). However, example embodiments are not limited to a material and a shape of the filler 800.

The filler 800 may be used to fixedly maintain the bended shape of the flexible circuit board FPCB. Also, the filler 800 may be configured to absorb impact to be exerted on the flexible circuit board FPCB from the outside, and this may make it possible to improve durability of the display device 1000-3.

According to some example embodiments, it may be possible to improve durability of a display device. In addition, it may be possible to reduce a thickness of the display device.

While aspects of some example embodiments of the present invention have been particularly shown and described, it will be understood by one of ordinary skill in the art that variations in form and detail may be made therein without departing from the spirit and scope of the attached claims and their equivalents.

What is claimed is:

1. A display device, comprising:
 a display panel, the display panel being flexible and including an active region for displaying an image, and a peripheral region outside the active region when viewed in a plan view;
 a window structure on the display panel;
 a printed circuit board electrically connected to the display panel;
 a flexible circuit board connecting the display panel to the printed circuit board; and
 a cover structure adjacent to the window structure, when viewed in the plan view,
 wherein the cover structure comprises:
 a cover portion overlapped with the flexible circuit board, when viewed in the plan view; and
 a sidewall portion extending downwardly from the cover portion, and
 wherein the cover portion has a bottom surface and the window structure has a bottom surface facing the display panel, and
 the bottom surface of the cover portion and the bottom surface of the window structure are on the same plane.

2. The display device of claim 1, wherein a side surface of the cover portion adjacent to the window structure is in contact with a side surface of the window structure.

3. The display device of claim 1, further comprising a folding region configured to be folded along a folding axis extending in a first direction, when viewed in the plan view, and
 the cover structure is adjacent to the window structure in a second direction crossing the first direction.

4. The display device of claim 3, further comprising a supporting structure below the display panel,
 wherein the supporting structure comprises a first supporting portion overlapped with the folding region and configured to be folded along the folding axis.

5. The display device of claim 4, wherein the first supporting portion comprises a plurality of joint portions, each of which has a rod shape extending in the second direction, the plurality of joint portions being arranged in the first direction and connected to each other.

6. The display device of claim 4, wherein the supporting structure further comprises at least one second supporting portion connected to the first supporting portion in the first direction and having a plate shape.

7. The display device of claim 3, further comprising a supporting structure below the display panel,
 wherein the supporting structure comprises a second supporting portion having a plate shape and overlapping a portion the display device excepting the folding region.

8. The display device of claim 1, wherein the cover structure comprises a metallic material.

9. The display device of claim 1, wherein the display panel further comprises an optical structure between the window structure and the display panel and including a polarization layer.

10. The display device of claim 1, further comprising an input-sensing unit between the window structure and the display panel and including a plurality of sensing electrodes.

11. The display device of claim 1, wherein the printed circuit board is below the display panel.

12. The display device of claim 11, further comprising a reinforcing member between the printed circuit board and the display panel.

13. The display device of claim 12, wherein the reinforcing member comprises a silicon-based material.

14. The display device of claim 1, further comprising a filler provided in an empty space that is defined by the cover portion, the sidewall portion, and the flexible circuit board.

15. The display device of claim 1, wherein the window structure comprises:
 a light-transmitting portion overlapped with the active region; and
 a light-blocking portion overlapped with at least a portion of the peripheral region.

16. A display device, comprising:
 a display panel, the display panel being flexible and including an active region for displaying an image, and a peripheral region outside the active region when viewed in a plan view;
 a window structure on the display panel;
 a printed circuit board below the display panel;
 a cover structure adjacent to at least a side of the window structure, when viewed in the plan view,
 wherein a portion of a side of the peripheral region of the display panel is bent downwardly and is connected to the printed circuit board,
 the cover structure comprises a cover portion overlapped with the portion of the side of the peripheral region of the display panel and a sidewall portion extending downwardly from the cover portion, and
 wherein the cover portion has a bottom surface and the window structure has a bottom surface, and
 the bottom surface of the cover portion and the bottom surface of the window structure are on the same plane.

17. The display device of claim 16, further comprising a folding region configured to be folded along a folding axis extending in a first direction, when viewed in the plan view, and
 the cover structure is adjacent to at least one side of the window structure in a second direction crossing the first direction.

18. The display device of claim 16, further comprising a reinforcing member between the printed circuit board and the display panel.

19. The display device of claim 16, further comprising a filler in an empty space defined by the cover portion, the sidewall portion, and the portion of the side of the peripheral region of the display panel.

20. A display device, comprising:
 a display panel, the display panel being flexible and including an active region for displaying an image, and a peripheral region outside the active region, when viewed in a plan view;
 a window structure on the display panel;
 a printed circuit board electrically connected to the display panel;
 a flexible circuit board connecting the display panel to the printed circuit board; and a cover structure adjacent the window structure, when viewed in the plan view, wherein the cover structure comprises:

a cover portion overlapped with the flexible circuit board, when viewed in the plan view; and a sidewall portion extending downwardly from the cover portion, wherein a side surface of the cover portion adjacent to the window structure is in contact with a side surface of the window structure, wherein the cover portion has a bottom surface and the window structure has a bottom surface, and the bottom surface of the cover portion and the bottom surface of the window structure are on the same plane.

* * * * *